United States Patent [19]

Swanson

[11] 4,234,352
[45] Nov. 18, 1980

[54] THERMOPHOTOVOLTAIC CONVERTER AND CELL FOR USE THEREIN

[75] Inventor: Richard M. Swanson, Los Altos, Calif.

[73] Assignees: Electric Power Research Institute, Inc., Palo Alto; Stanford University, Stanford, both of Calif.

[21] Appl. No.: 928,103

[22] Filed: Jul. 26, 1978

[51] Int. Cl.³ .......................................... H01L 31/06
[52] U.S. Cl. .................................. 136/253; 136/256; 136/255
[58] Field of Search ........... 136/89 RT, 89 SJ, 89 CC

[56] References Cited

U.S. PATENT DOCUMENTS

| | | | |
|---|---|---|---|
| 3,331,707 | 7/1967 | Werth | 136/89 |
| 3,549,960 | 12/1970 | Wedlock | 357/30 |
| 3,929,510 | 12/1975 | Kittl | 136/206 |

OTHER PUBLICATIONS

B. D. Wedlock, "Thermo-Photo-Voltaic Energy Conversion," *Proceedings IEEE*, May 1963, pp. 694–698.
C. W. Kim et al., "A P-I-N Thermophotovoltaic Diode," *IEEE Trans. Electron Devices*, vol. ED-16, pp. 657–663 (1969).
General Motors Corp., "Study of a Thermophotovoltaic Converter," Final Report, Contract No. DA 36-03-9-AMC-02255(E), Feb. 1964.
R. J. Schwartz et al., "Thermophotovoltaic Cells," Final Report, Contract No. DAAB 07-72-C-0281 (Jun. 1974).

*Primary Examiner*—Aaron Weisstuch
*Attorney, Agent, or Firm*—Flehr, Hohbach, Test

[57] ABSTRACT

Disclosed is a thermophotovoltaic converter which includes a parabolic cone radiation concentrator portion and a processor portion including a radiator which absorbs concentrated radiation and generates incandescent radiation. A photovoltaic cell in close proximity to the radiator receives the incandescent radiation and generates an electrical voltage. The cell includes an intrinsic or lightly doped silicon substrate having a top surface for receiving radiation and a bottom surface having a plurality of diffused N and P conductivity regions arranged in rows. A titanium-silver layer overlays the bottom surface and conductively interconnects regions of one conductivity type and provides a reflective surface to photons which pass through the substrate.

17 Claims, 10 Drawing Figures

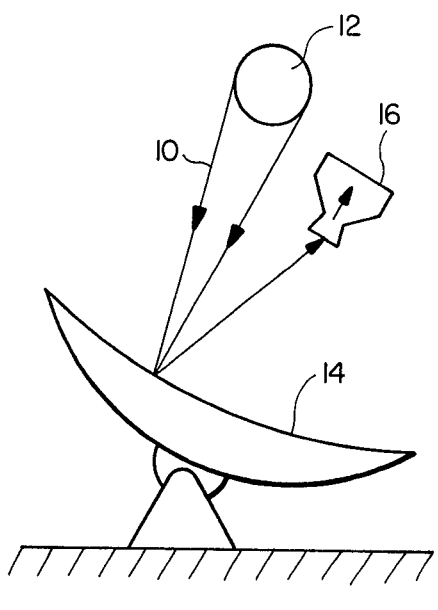
FIG_1
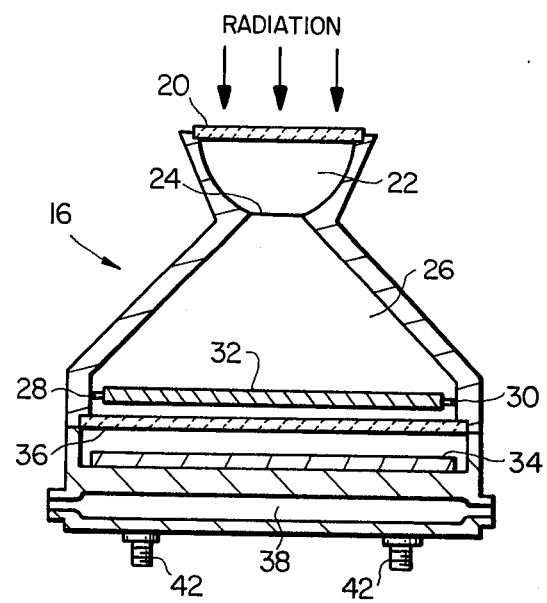
FIG_2
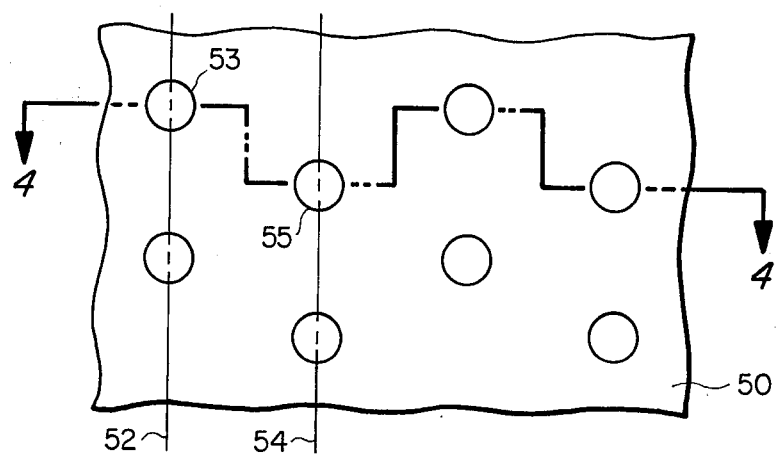
FIG_3
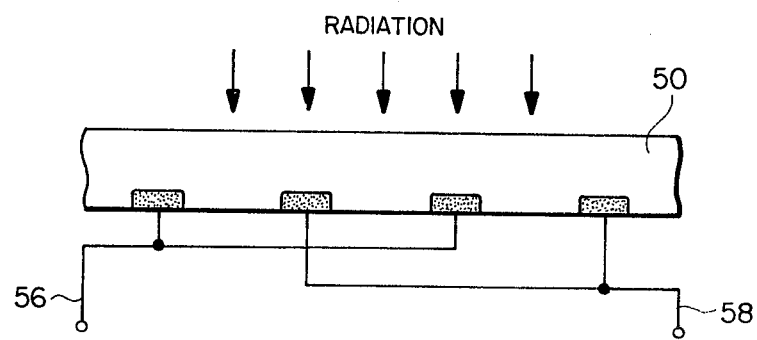
FIG_4

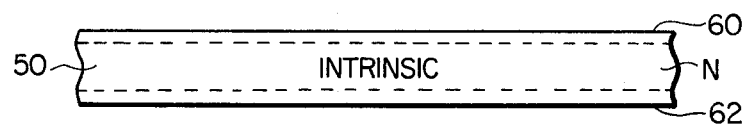
FIG_5
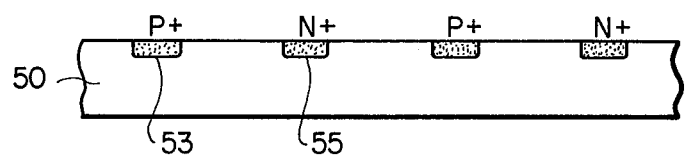
FIG_6
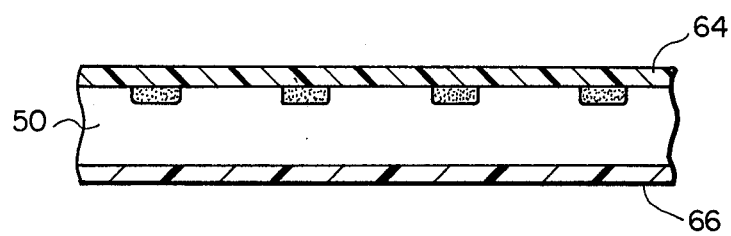
FIG_7
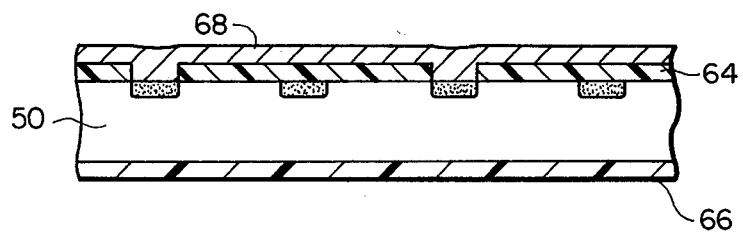
FIG_8
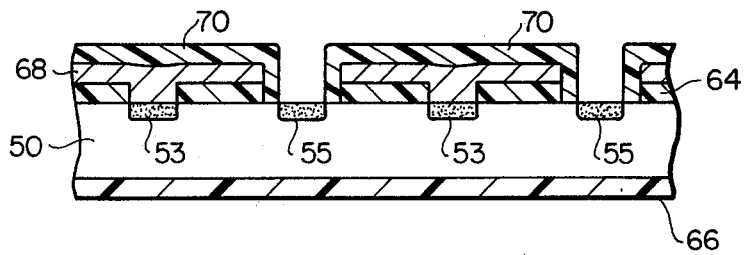
FIG_9
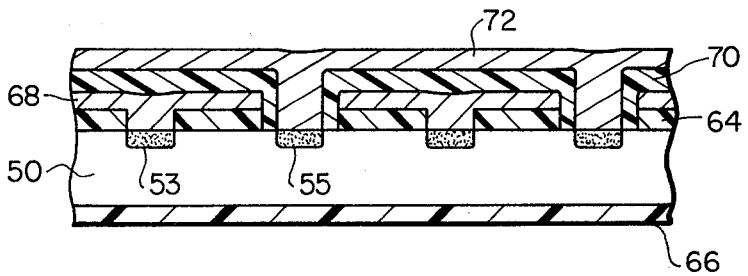
FIG_10

THERMOPHOTOVOLTAIC CONVERTER AND CELL FOR USE THEREIN

BACKGROUND OF THE INVENTION

This invention relates generally to systems for converting thermal and radiant energy into electrical energy, and more particularly the invention relates to thermophotovoltaic conversion systems and to photovoltaic cells useful therein.

Solar radiation is recognized as an unlimited source of energy if properly harnessed. Many techniques have been suggested for converting solar radiation into thermal energy, and in recent years much attention has been directed to the direct conversion of solar radiation into electrical energy through use of photovoltaic cells.

The photovoltaic cell comprises a substrate of semiconductive material having a P-N junction defined therein. In the planar silicon cell the P-N junction is formed near a surface of the substrate which receives impinging radiation. Radiated photons create mobile carriers (holes and electrons) in the substrate which can be directed to an electrical circuit outside of the cell. Only photons having at least a minimum energy level (e.g. 1.1 electron volts for silicon) can generate an electronhole pair in the semiconductor material. Photons having less energy are either not absorbed or are absorbed as heat, and the excess energy of photons having more than 1.1 electron volts energy (e.g. photons having a wavelength of 1.1 microns and less) creates heat. These and other losses limit the efficiency of photovoltaic cells in directly converting solar radiation to electricity to the order of 10-20%.

Attempts at increasing the efficiency of photovoltaic cells have focused on the actual cell structure and on limiting wavelengths, and thus photon energy, of impinging radiation. One technique for achieving a bandemission spectrum of radiation is thermovoltaic conversion as described by Wedlock in "Thermo-Photo-Voltaic Energy Conversion," *Proceedings of the IEEE*, May, 1963, pages 694-698. As described by Wedlock, thermal radiation is absorbed by a black body radiator which, in turn, generates a spectrum of radiation containing photons with energy levels in excess of a threshold required to generate the carriers in a photovoltaic cell. The photovoltaic cell is illuminated with the radiated spectrum from the black body radiator. U.S. Pat. No. 3,929,510 to Kittl discloses a solar radiation conversion system employing thermo-photovoltaic conversion.

Improvements in cell structure have focused primarily on increased absorption of photons and increased lifetime of minority carriers created by the absorption of photons. Kim and Schwartz, *IEEE Trans. on Electron Devices*, ED-16, No. 7, July, 1969, pages 657-663 popose an intrinsic photovaltaic diode. The significant factors necessary for the proposed P-I-N structure to be effective include high doping of the N and P regions, a high lifetime intrinsic region, and surface treatment to minimize surface recombination of holes and electrons and to minimize reflection loss. The cell proposed by Kim and Schwartz comprises a substrate of intrinsic germanium having spaced alloy regions of alternating conductivity type in one surface of the substrate. Kim and Schwartz recognize the physical limitations of such a structure for silicon photo cells.

SUMMARY OF THE INVENTION

An object of the present invention is an improved photovoltaic conversion system.

Another object of the invention is an improved photovoltaic cell.

Briefly, in accordance with the invention, a thermophotovoltaic conversion system is provided which includes means for collecting and concentrating solar radiation, means for receiving the concentrated solar radiation and re-radiating energy, and a photovoltaic cell for receiving the re-radiated energy and generating an electrical voltage. The means for receiving concentrated radiation includes a housing having a radiation receiving window, a secondary concentrator defined by walls of the housing within the window, and a chamber for confining the concentrated radiation. A radiator element may be positioned within the chamber for receiving the concentrated radiation, and the photovoltaic cell is positioned within the chamber in close proximity to the radiator element for receiving radiated energy from the radiator. Importantly, the converter has applicability with heat sources other than solar radiation wherein a radiator element is not required within the converter.

The photovoltaic cell includes a monocrystalline semiconductor substrate having first and second opposing surfaces. The substrate is positioned whereby impinging radiation is received by the first surface, and a plurality of P and N doped regions are formed in the substrate. In one embodiment of the invention the doped regions are formed in the second surface in alternating conductivity rows. A feature of the invention is a reflective layer provided on the second surface which interconnects regions of a first conductivity type.

The invention and objects and features thereof will be more fully understood by the following detailed description and appended claims when taken with the drawing.

BRIEF DESCRIPTION OF THE DRAWINGS

FIG. 1 is a functional schematic representation of a thermophotovoltaic conversion system in accordance with the invention.

FIG. 2 is a side view in section of a thermophotovoltaic converter in accordance with the invention.

FIG. 3 is a bottom view of a semiconductor wafer for use in a photovoltaic cell in accordance with the invention.

FIG. 4 is a section view of the semiconductor wafer shown in FIG. 3 taken along the line 4—4.

FIGS. 5-10 illustrate in cross section the steps in fabricating the photovoltaic cell in accordance with the invention.

DESCRIPTION OF THE PREFERRED EMBODIMENT

FIG. 1 is a functional schematic diagram of a thermophotovoltaic conversion system energized by solar radiation. Radiation 10 from the sun 12 is received by a concentrator such as parabolic reflector 14, and the concentrator directs the radiation to a converter shown generally at 16. Concentrator 14 is preferably a two axis steerable paraboloidal mirror and the receiving window of converter 16 is located at the paraboloid's focus. It will be appreciated that other concentrators such as a Cassagrain two mirror system could be employed. Typically, about 85% of the incident light is specularly reflected toward the converter. The concentrated sunlight enters through the receiving window of the converter and receives additional concentration by secondary concentrator, as will be described with respect to FIG. 2. Approximately 7% of the incident light will be radiated out of the cavity, and the remaining 72% is available to the thermophotovoltaic photo cell therein. With thermophotovoltaic conversion efficiency of 42%, the overall system efficiency is approximately 30%.

Referring now to FIG. 2, a side view of the thermophotovoltaic converter is shown in section. The converter includes a spectral processor portion which accepts the concentrated sunlight at the entry and converts the solar radiation into a spectral band centered about photon energies at, and slightly above, the bandgap energy of the photovoltaic cell. The photovoltaic cell then converts this radiation into electricity. The concentrated solar radiation enters the window of the converter through a heat mirror 20 which is transparent at wavelengths less than 1.85 microns and reflective at greater wavelengths. The walls of the converter housing define a parabolic cone concentrator shown generally at 22 which provides a nonimaging concentration system and increases the concentration of the solar radiation to approximately 20,000 times at the throat 24.

The concentrated radiation passes through throat 24 and enters cavity 26. The walls of the housing which define cavity 26 are preferably made of polished and silvered aluminum to provide a highly reflective surface. Mounted within cavity 26 by suitable thermally insulative standoffs 28 and 30 is a high temperature refractory radiator 32. The concentrated radiation is absorbed by radiator 32 which heats to a temperature in the range of 1800°-2000° C. The narrow throat 24 and the heat mirror 22 contain the radiation in the cavity thereby increasing the absorption efficiency of the radiator. A tungsten radiator, for example, will re-radiate energy having greater intensity than solar radiation at about one micron wavelength, which is compatible with the energy level required to generate charge carriers in a silicon cell. Because of the high temperatures involved, the cavity 26 is evacuated or an inert atmosphere such as argon is provided therein.

Positioned in close proximity to radiator 32 is a photovoltaic cell 34 with a second heat mirror 36 positioned therebetween. Since the efficiency of a silicon cell decreases with operating temperature, a coolant is provided in chamber 38 which abuts the support for the silicon cell 34. The coolant, water for example, may be contained in a closed system with a heat exchanger provided to the ambient atmosphere. Electrical contacts 42 are provided through the housing of the converter and interconnect with the photovoltaic cell to drive an external circuit.

The heat mirror 36 passes radiation with wavelengths shorter than the maximum capable of producing electron-hole pairs in the photo cell (e.g. 1.1 microns for silicon) and reflects longer wavelengths. Accordingly, the energy which the photo cell cannot use is reflected back onto the radiator and reabsorbed. Alternatively, the longer wavelength radiation can be allowed to impinge directly on the photo cell, which is relatively transparent to this radiation, and the radiation is reflected off the back contact of the cell and returns to the radiator. While some heating of the cell will result from the longer wavelength radiation, if the long wavelength losses within the cell are found to be sufficiently low, heat mirror 36 can be eliminated.

The described thermophotovoltaic converter is particularly useful in a solar radiation system. However, the converter does have applicability in other systems where high temperatures are generated. Thus, the converter could be used in a heat engine as part of a topping cycle.

An important element in the thermophotovoltaic converter in accordance with the invention is the photovoltaic cell. FIG. 3 is a bottom view of the semiconductor substrate of the photovoltaic cell 34 in FIG. 2. Substrate 50 comprises intrinsic or lightly doped monocrystalline semiconductor material, preferably silicon, in which alternating rows 52 and 54 of P type and N type doped regions occupying a minimal area of the substrate surface, respectively, are formed. With reference to the side view in section of the substrate 50 shown in FIG. 4, taken along line 4—4 of FIG. 3, it is noted that the alternating rows are interconnected to provide the electrical output terminals 56 and 58. In a preferred embodiment the semiconductor substrate 50 has a thickness of 100 microns, each of the diffused regions 53, 55 has a diameter of 20 microns and a depth of 0.2 micron, and the spacing between rows and between diffused regions in each row is 100 microns. As shown in FIG. 3 each diffused region in row 54 is staggered with respect to the diffused regions of row 52. The semiconductor substrate is provided with highly polished top and bottom surfaces, and as will be described further hereinbelow with respect to the fabrication of the semiconductor cell, a highly reflective conductor is provided on the bottom surface to interconnect diffused regions and also provide a reflective surface for photons which pass through the cell without being absorbed, thus increasing the efficiency of the cell.

Fabrication of the photovoltaic cell will be described with reference to the section views of the semiconductor wafer illustrated in FIGS. 5-10. The cell is turned bottom side up for illustration purposes in FIGS. 5-10.

In FIG. 5 an intrinsic or lightly doped N-type silicon substrate 50, as described above, is provided. Preferably, the doping of the bulk substrate material is $10^{14}$ dopant atoms per cubic centimeter or less. Shallow diffused regions 60 and 62 are formed in the opposing surfaces of the wafer by the diffusion of an N type dopant such as phosphorous into the surfaces to a depth of 0.1 micron. The maximum surface dopant concentration of the diffused regions 60 and 62 is $10^{18}$ atoms per cubic centimeter.

In FIG. 6 conventional photoresist masking and etching techniques are employed to define diffusion windows through an oxide layer for selectively diffusing P+ regions 53 and then N+ regions 55 into the surface of substrate 50. The maximum dopant concentration in each of the diffused regions is on the order of $10^{21}$ atoms per cubic centimeter, and as described above the depth of the diffused regions is approximately 0.2 micron. As shown in FIG. 7, silicon oxide layers 64 and 66 are then formed on the surfaces of substrate 50. The masking oxide and the oxide which is thermally grown during diffusion of the regions 53, 55 are preferably stripped and new oxide layers 64 and 66 each with a thickness of about 0.175 micron are formed by conventional chemical vapor deposition. The oxide thickness is approximately one-quarter wavelength at one micron wavelength for silicon material, thus enhancing reflectivity of photons having energy corresponding to the bandgap energy level of silicon. It will be appreciated that the oxide thickness will vary for other semiconductor material.

As shown in FIG. 8, windows are formed through the oxide 64 overlying the P+ regions 53 and an electrical interconnection pattern 68 is deposited over the oxide 64 and on the P+ regions 53.

In accordance with one feature of the invention the interconnect pattern 68 comprises a thin layer of titanium which is overlayed by a thin layer of silver. The titanium is vapor deposited to a thickness of approximately 10 angstroms directly on the exposed surface of diffused region 53 and on the surface of the silicon oxide layer 64. Other metals, such as chrome, may be used instead of titanium. Thereafter, a thin layer of silver is vapor deposited on the titanium layer to a thickness of approximately 1 micron. The titanium provides a good adhering surface for the silver, and the silver provides a highly reflective surface for the radiation which passes through the semiconductor substrate. Thereafter, the silver surface is selectively masked by photoresist and windows are etched through the silver-titanium layer and the silicon oxide to the surface of the N+ diffused regions 55 and the semiconductor substrate. Ferric nitrate is a suitable etchant for the silver layer and buffered hydro-fluoric acid is used to etch the titanium and oxide layers. As shown in FIG. 9 an insulating layer 70 of silicon oxide is formed over the surface and the oxide overlying the N+ regions 55 is removed by photoresist masking and etching. A thin layer of titanium may be deposited on the silver layer 68 to enhance adherence of the oxide. Thereafter, a second electrical interconnect pattern 72 is formed on the surface of the water as shown in FIG. 10, to interconnect the P+ regions 55. The electrical interconnect pattern 72 is formed according to the process described above with reference to the interconnect pattern 68 by depositing a thin layer of titanium and subsequently depositing a thin layer of silver over the titanium.

The photovoltaic cell substrate processed in accordance with the present invention provides a high minority carrier lifetime. Further, increased efficiency is achieved by the provision of the silicon oxide layer and the highly reflective electrical interconnect pattern comprising the titanium-silver conductive layer. The pattern of the diffused N+ and P+ regions optimally increases the collected current of the cell while minimizing the area of the N+ and P+ contact areas which are not as reflective as the intermediate space.

The photovoltaic cell and converter in accordance with the present invention has particular applicability in a thermophotovoltaic solar energy system. However, the converter and cell may also be advantageously employed in other thermophotovoltaic applications and where the converter is heated by a source other than the sun.

While the invention has been described with reference to specific embodiments, the description is illustrative of the invention and is not to be construed as limiting the scope of the invention. Various modifications, changes, and applications may occur to those skilled in the art without departing from the true spirit and scope of the invention as defined by the appended claims.

What is claimed is:

1. A thermophotovoltaic conversion system comprising:

(a) means for collecting and concentrating solar radiation, (b) means for receiving said concentrated solar radiation and re-radiating energy and including a housing having a radiation receiving window, a chamber for confining said concentrated radiation, and a radiator element within said chamber for receiving said concentrated radiation and re-radiating energy, and (c) a photovoltaic cell for receiving said re-radiated energy and generating an electrical voltage, said cell including a monocrystalline semiconductor substrate having first and second opposing surfaces, said substrate being positioned with respect to said means for re-radiating energy whereby said re-radiated energy is received by said first surface, a first plurality of rows of doped regions of a first conductivity type in said second surface, a second plurality of rows of doped regions of a second conductivity type in said second surface, said first plurality of rows being interleaved with said second plurality of rows, each of said rows comprising a plurality of spaced apart doped regions occupying a minimal area of said second surface, first optically reflective conductive means electrically interconnecting said first plurality of rows of doped regions, a reflection enhancement layer provided between said first conductive means and said second surface except at said first plurality of doped regions, and second conductive means electrically interconnecting said second plurality of rows of doped regions whereby said electrical voltage is generated between said first and second conductive means.

2. A thermophotovoltaic conversion system as defined by claim 1 wherein said first conductive means comprises a layer of titanium and a layer of silver over said titanium layer and said first conductive means is separated from said substrate except over said first plurality of regions by a reflection enhancement layer of silicon oxide.

3. A thermophotovoltaic conversion system as defined by claim 2 wherein each doped region in a row is offset from doped regions in adjacent rows.

4. A thermophotovoltaic conversion system as defined by claim 1 wherein said means for receiving concentrated solar radiation further includes a secondary concentrator defined by walls of said housing within said window.

5. A thermophotovoltaic conversion system as defined by claim 4 wherein said photovoltaic cell is positioned within said chamber in close proximity to said radiator element.

6. A thermophotovoltaic conversion system as defined by claim 5 wherein said housing includes a first heat mirror disposed across said window and a second heat mirror disposed between said radiator element and said photovoltaic cell.

7. A thermophotovoltaic conversion system as defined by claim 4 wherein said housing includes a first heat mirror disposed across said window.

8. A thermophotovoltaic conversion system as defined by claim 4 wherein said chamber has optically reflecting interior surfaces.

9. For use with a thermal radiation source, a thermophotovoltaic converter comprising a housing having a means adapted for receiving radiant energy from said source, a chamber for confining said radiant energy, and a photovoltaic cell for receiving said radiant energy and generating an electrical voltage therefrom, said cell being arranged to reflect to said thermal radiation source the unabsorbed portion of said received radiant energy, said cell including a monocrystalline semiconductor substrate having first and second opposing surfaces, said substrate adapted to be positioned with respect to said radiation source whereby said radiated energy is received by said first surface, a first plurality of rows of doped regions of a first conductivity type in said second surface of said substrate, a second plurality of rows of doped regions of a second conductivity type in said second surface of said substrate, said first plurality of rows being interleaved with said second plurality of rows, each of said rows comprising a plurality of spaced apart doped regions occupying a minimal area of said second surface, first optically reflective conductive means electrically interconnecting said first plurality of rows of doped regions, a reflection enhancement layer provided between said first conductive means and said second surface except at said first plurality of doped regions, and second conductive means electrically interconnecting said second plurality of rows of doped regions whereby said electrical voltage is generated between said first and second conductive means.

10. A thermophotovoltaic converter as defined by claim 9 wherein said substrate is silicon and said reflection enhancement layer comprises silicon oxide.

11. A thermophotovoltaic converter as defined by claim 10 wherein said first conductive means comprises a layer of titanium and a layer of silver over said titanium layer.

12. A thermophotovoltaic converter as defined by claim 9 wherein each doped region in a row is offset from doped regions in adjacent rows.

13. A photovoltaic cell for receiving radiation and generating an electrical voltage therefrom, said cell including a monocrystalline semiconductor substrate having first and second opposing surfaces, said substrate adapted to be positioned whereby said radiation is received by said first surface, a first plurality of rows of doped regions of a first conductivity type in said second surface of said substrate, a second plurality of rows of doped regions of a second conductivity in said second surface of said substrate, said first plurality of rows being interleaved with said second plurality of rows, each of said rows comprising a plurality of spaced apart doped regions occupying a minimal area of said second surface, first optically reflective conductive means electrically interconnecting said first plurality of rows of doped regions, a reflection enhancement layer provided between said first conductive means and said second surface except at said first plurality of doped regions, and second conductive means electrically interconnecting said second plurality of rows of doped regions whereby said electrical voltage is generated between said first and second conductive means.

14. A photovoltaic cell as defined by claim 13 wherein said substrate is silicon and said reflection enhancement layer comprises silicon oxide.

15. A photovoltaic cell as defined by claim 13 wherein said first conductive means comprises a layer of titanium and an overlying of silver and further including a layer of silicon oxide having an effective optical thickness of approximately one-quarter of one micron wavelength, said layer of silicon oxide separating said first conductive means from said substrate except at said first plurality of regions.

16. A photovoltaic cell as defined by claim 13 wherein said second conductive means comprises a layer of titanium and a layer of silver over said titanium layer.

17. A photovoltaic cell as defined by claim 13 wherein each doped region in a row is offset from doped regions in adjacent rows.

* * * * *